US011237193B2

(12) United States Patent
Townsend

(10) Patent No.: US 11,237,193 B2
(45) Date of Patent: Feb. 1, 2022

(54) SYSTEM AND METHOD OF POWER GRID MONITORING

(71) Applicant: Live Power Intelligence Company NA, LLC, Boulder, CO (US)

(72) Inventor: William Townsend, Boulder, CO (US)

(73) Assignee: Live Power Intelligence Company NA, LLC, Boulder, CO (US)

(*) Notice: Subject to any disclaimer, the term of this patent is extended or adjusted under 35 U.S.C. 154(b) by 515 days.

(21) Appl. No.: 16/077,445

(22) PCT Filed: Feb. 13, 2017

(86) PCT No.: PCT/IB2017/050790
§ 371 (c)(1),
(2) Date: Aug. 10, 2018

(87) PCT Pub. No.: WO2017/137964
PCT Pub. Date: Aug. 17, 2017

(65) Prior Publication Data
US 2019/0049492 A1 Feb. 14, 2019

Related U.S. Application Data
(60) Provisional application No. 62/294,056, filed on Feb. 11, 2016.

(51) Int. Cl.
*G01R 19/25* (2006.01)
*G01R 23/20* (2006.01)
*H02J 13/00* (2006.01)
(52) U.S. Cl.
CPC ......... *G01R 19/2513* (2013.01); *G01R 23/20* (2013.01); *H02J 13/0017* (2013.01);
(Continued)

(58) Field of Classification Search
CPC ............... G01R 19/2513; G01R 23/20; H02J 13/00002; H02J 13/0017; H02J 13/0075;
(Continued)

(56) References Cited

U.S. PATENT DOCUMENTS

| 4,709,339 A | 11/1987 | Fernandes |
| 5,408,176 A | 4/1995 | Blatt et al. |

(Continued)

FOREIGN PATENT DOCUMENTS

| WO | 0179872 | 10/2001 |
| WO | 2006112839 | 10/2006 |

(Continued)

OTHER PUBLICATIONS

M. McGranaghan, "Learning to Read Waveform Signatures," Sep. 1, 2008.
(Continued)

*Primary Examiner* — John H Le
(74) *Attorney, Agent, or Firm* — 24IP Law Group USA, PLLC; Timothy DeWitt

(57) ABSTRACT

The application discloses a method and apparatus for determining an operational status of one or more power grid components (35) of a power grid (30). The grid components (35) have component signatures representative of the operational status of the power grid component (35). The method includes obtaining, using a monitor (20), at least one of a current waveform or a voltage waveform at a location, analyzing the obtained one of the current waveform or the voltage waveform, establishing one or more waveform data values of the waveform, accessing a database having a plurality of component signatures, and by comparison of the waveform data values with the component signatures producing one or more results representative of the operational status.

6 Claims, 6 Drawing Sheets

(52) U.S. Cl.
CPC ........... *H02J 13/0075* (2013.01); *Y02E 60/00* (2013.01); *Y04S 10/30* (2013.01); *Y04S 40/126* (2013.01)

(58) Field of Classification Search
CPC ..... Y02E 60/00; Y02E 60/74; Y02E 60/7853; Y04S 10/30; Y04S 40/126; G06F 1/3209; G06F 1/3287
USPC .............................. 702/60, 61; 700/295, 296
See application file for complete search history.

(56) References Cited

U.S. PATENT DOCUMENTS

| | | | |
|---|---|---|---|
| 5,473,244 A | 12/1995 | Libove et al. | |
| 8,374,729 B2* | 2/2013 | Chapel | H02J 3/00 700/295 |
| 9,588,534 B2* | 3/2017 | Chapel | H04L 12/4633 |
| 2006/0235574 A1* | 10/2006 | Lapinski | H02J 13/00034 700/286 |
| 2010/0145542 A1* | 6/2010 | Chapel | H02J 13/00034 700/295 |
| 2011/0010118 A1* | 1/2011 | Gaarder | G01R 21/133 702/60 |
| 2015/0066227 A1* | 3/2015 | Chapel | G05F 1/66 700/295 |
| 2016/0109492 A1* | 4/2016 | Labatie | G01R 19/2513 702/61 |
| 2018/0259556 A1* | 9/2018 | Labatie | G01R 21/133 |

FOREIGN PATENT DOCUMENTS

| | | |
|---|---|---|
| WO | 2007030121 | 3/2007 |
| WO | 2013135773 A1 | 9/2013 |

OTHER PUBLICATIONS

C. Laughman, et al., "Power signature analysis," IEEE power & energy magazine, pp. 56-63 (2003).

C Sankaran, "Effects of Harmonics on Power Systems," Oct. 1, 1999.

C Sankaran, "Effects of Harmonics on Power Systems—Part 2," Feb. 1, 1999.

* cited by examiner

SYSTEM AND METHOD OF POWER GRID MONITORING

CROSS REFERENCE TO RELATED APPLICATION

This application claims priority to and benefit of U.S. Provisional Patent Application No. 62/294,056 filed on 11 Feb. 2016 entitled "System and Method Power Grid Monitoring". The contents of this application are incorporated herein by reference.

FIELD

The present disclosure relates generally to monitoring, modeling and management of systems and, more particularly, to real-time monitoring and determination of the operational status of electric power generators, loads and other components connected to an electric power grid.

BACKGROUND

Electric power for general use is produced, transported, managed and delivered through a system of generators, transmission lines, distribution lines and related components generally referred to as a "power grid." A feature of many modern power grids is that electric power is traded between various market participants. The wholesale trading of electric power occurs in both organized exchanges and in over-the-counter markets which provide competitive markets for producers and consumers of wholesale electric power. The financial derivatives and forward markets provide opportunities to hedge risks related to congestion on the grid and the uncertainty related to future prices.

Traded markets for electric power operate similarly to traded markets for other commodities, and market operations are well documented and understood. Market participants trade electric power for physical delivery very similar to other commodities as well as in financially settled contracts and derivatives. Participants in these electric power markets include power generators, electric utilities, government and quasi-government agencies, banks, hedge funds and other participants, and in a broader sense participants include front end participants, such as fuel suppliers, end users such as companies or households that use electricity, and ancillary participants that trade in carbon credits, "green" power and related regulation-based products. Every participant in an electric power market is affected by the operation of that market.

Given that electric power is not easily stored at scale, the instantaneous production, transmission and consumption of electric power (accounting for system losses) must be in near-perfect balance to avoid reliability concerns, brown outs or blackouts on the power grid. The market for electric power sets the price for balancing that supply and demand in real-time usually in the form of 5-, 10- or 15-minute prices. Power system operators must manage the components of the power system very precisely, and any disruptions or changes to those operations can affect reliability and market price significantly.

There is therefore need to provide information about the production, transmission and consumption of electric power to the market participants to enable the market to run efficiently. Much of the information required is, however, confidential. For example, the power generators are reluctant to provide publicly real-time data as this will influence the sale price of the power. On the other hand, power consumers and brokers wish to have such data to enable them to price the electricity correctly. Several companies have therefore emerged which endeavor to supply such information. These include, for example, Ably AS in Scandanavia and Genscape, Inc., in the United States and Europe.

Both companies have developed technology that enables them to estimate power generation, transmission and consumption. For example, Genscape, Inc, has filed an international patent application No. WO 01/79872 which teaches an apparatus and method for the measurement and monitoring of electrical power generation and transmission. This application teaches a monitoring device with a weatherproof housing containing electrical potential and magnetic field measurement components to measure the electromagnetic field about a high voltage transmission line.

Another patent application assigned to Genscape is the international patent application No. WO 2007/030 121 which teaches a method for monitoring the power flowing through an electric power transmission line using a plurality of magnetic field monitors to acquire magnetic field data and performing a computational analysis on said magnetic field data to determine the power flow through the electric power transmission line.

International patent application No. WO 2006/112839, also assigned to Genscape, teaches a method for substantially real-time monitoring of the operation dynamics of the components of an AC power grid by obtaining power signal frequency information for the AC power signal at a plurality of know locations. The power signal frequency information is analyses to identify power grid events and their location.

SUMMARY

The current disclosure is directed to systems, methods and apparatuses (i.e., utilities) that allow a user to determine in near-real-time the operational status of one or more components of an operating power grid. These utilities use the analysis of harmonic frequencies and other waveform anomalies to determine these operational statuses.

The presented utilities help inform market participants about sudden changes in the supply of power and/or the operation of power grid components that can affect price or reliability. This may allow such participants to make decisions to mitigate exposure to rapidly changing prices and conditions in the real-time market. Many market participants do not have complete, timely or accurate information about the operation of the various power grid components, and would benefit significantly with better access to such information.

For example, at any point in time, a sudden unexpected outage of a generator or power plant due to mechanical failure or other event (e.g., generator start-up) may have a significant and immediate impact on the price of power or a related commodity (e.g., natural gas). Current systems for informing participants about such a change are incomplete, limited with respect to timeliness and accuracy, and in many cases very expensive to operate or to purchase.

A function of any system that attempts to inform market participants about the operation of the power grid is the ability to identify, measure and report on the operation of the various individual components of the power grid, ideally in near real time. Various systems exist to accomplish this and are described in the art, as described above.

Every generator that is connected to the power grid providing electrical power is said to be "synchronous" and produced AC electricity with a frequency of 60 Hertz in North America and other similar frequencies in other regions of the world, e.g. 50 Hz in Europe. These frequencies are not perfect, however, and contain various sub-frequencies such as harmonic frequencies and/or other waveform anomalies such as deviations from perfect sinusoidal shape. Many things that produce sinusoidal time-varying outputs create harmonics. For power generators, in particular, and for other components connected to a power grid, the specifics of the manufacturing of the equipment or conditional variations between components can create harmonic signals or other waveform anomalies. For example, minute differences in the placement of stators and the pitch of windings and the exact speed of the generator will cause each generator to produce slightly different harmonics. Harmonics in this sense may be sinusoidal waveforms or may be non-sinusoidal waveforms such as square waves, sawtooth waves, spikes, or other shapes. In many cases these harmonics create a unique generator (or other power system component) "signature" that can be ascribed to the operation of that particular generator (or other power system component). The uniqueness of the signature may be inherent to the component itself, per the prior example, or the signature may be due to the location of the generator within the power grid, the condition and configuration of the local power grid, and the location at which a signal is measured. The signal may be either representative of the voltage or of the current.

For every power grid component of the power grid, a unique component signature may be determined. This unique component signature may then be used for further calculation as described herein. The component signature may be determined fundamentally, by analysis of the component in isolation (either actual or practical via sampling very closely to the component on the power grid), or dynamically by empirically associating the measured signals with the components that are creating such signals. A fundamental determination may be done via computer modeling (for example, using finite element analysis of the component) or by rack testing of the components, or such determination may be made by sampling from the power grid at a location that is close enough to the component yet sufficiently distant from other contributing components that the measured signal is the product almost entirely of the target component. Dynamic determination may be accomplished by sampling signals at one or more locations and comparing this data to either contemporaneously measured values for the operation of one or more power grid components, or to models of the power grid operating in various configurations.

Although the generation of harmonics is known in the art, a further description follows, supplied by Sankaran, C in the article Effects of Harmonics on Power Systems: A pure sinusoidal voltage is a conceptual quantity produced by an ideal AC generator built with finely distributed stator and field windings that operate in a uniform magnetic field. Since neither the winding distribution nor the magnetic field are uniform in a working AC machine, voltage waveform distortions are created, and the voltage-time relationship deviates from the pure sine function. The distortion at the point of generation is very small (about 1% to 2%), but nonetheless it exists. Because this is a deviation from a pure sine wave, the deviation is in the form of a periodic function, and by definition, the voltage distortion contains harmonics.

Stator winding pitch affects harmonics in that ⅚th pitch windings suppress 5th and 7th voltage harmonics but may enhance the triple harmonics (third, ninth etc.) and ⅔rd pitch windings suppress the triple harmonics but may enhance the 5th and 7th. In addition, ⅔rd pitch wound machines generally have lower zero sequence reactances that can increase the single phase fault current.

Generators themselves produce some 5th harmonic voltages due to magnetic flux distortions that occur near the stator slots and non-sinusoidal flux distribution across the air gap.

These harmonics are considered to be undesirable for both the power producer and the grid operator and therefore are minimized or removed in extreme cases. They exist nonetheless and can be measured as described herein.

The presented utilities use waveform, spectral and/or harmonic analysis to determine the operational status of power grid components, which information may be further used to communicate such information to market participants and/or to model market prices, power grid operating conditions and future anticipated operational dynamics of the power grid. The system delivers information in near real time and/or via historical information to interested power grid participants such as traders, grid operators and grid regulators, and to other parties interested in the operation of the power grid. Of particular value is the system's ability to inform markets of power component "events" such as generator trips, transmission line de-ratings and operating changes with major loads.

Though the presented utilities are operative to determine the operation of individual power grid components, in various aspects the utilities may be utilized to monitor an entire gird or any sub-section of the grid, which may include numerous (e.g., hundreds or thousands) of individual components.

In one aspect, a monitoring device is provided that is operative to directly measure voltage and/or current at a predetermined location relative to a monitored power grid component. In one arrangement, the monitoring device may be plugged into a standard wall outlet. The device may report the monitored voltage and/or current to a remote server (e.g., cloud based etc.). Such reporting may be done in real time via a network interface and any appropriate protocol. Further the device may report data in raw form or preprocess the data. In one arrangement, the device may include location reporting (e.g., GPS) functionality.

In another aspect, data received from one or more monitoring devices is processed to generate a priori expected values for each sample location for a range of known operating status conditions. Such processing typically includes performing spectral analysis of received data to generate signatures that may be associated with known operating conditions of a power grid component. Accordingly, once a database of such signatures is created, a current signature of a monitored power grid component may be compared to the database signatures to determine the current status of that component. In another arrangement, a database of waveforms (e.g., free of spectral or harmonic analysis) may be generated and subsequently utilized to determine a current status of a power grid component. In further arrangements, signatures from two or more power grid components may be utilized with predetermined signatures associated with power grid events. Use of multiple signatures may allow predicting upcoming events (e.g., disruptive events, brown outs, etc).

Once a current status of a power grid component is determined, such status information may be provided to interested parties. Such interested parties may receive such information by any appropriate means. Likewise, such interested parties may be part of subscription service. In addition, such parties may receive real time and/or historical information that may be utilized with, for example, supply and demand models.

In another aspect, a system is provided where a plurality of monitoring devices are placed at known locations within a power grid to monitor power grid components. The plurality of devices may report monitored data (e.g., voltage or current waveform data) to a remote processing platform (e.g., cloud based server). The processing platform may utilize the received data to monitor and/or predict power grid events.

DETAILED DESCRIPTION OF THE INVENTION

Figure 1:
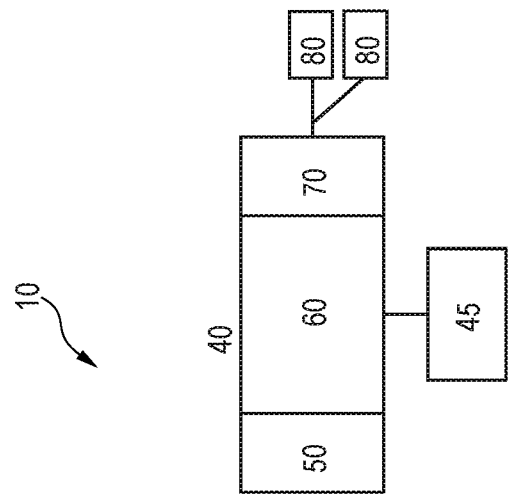
FIG. 1 shows an overview of the system.
Figure 1:
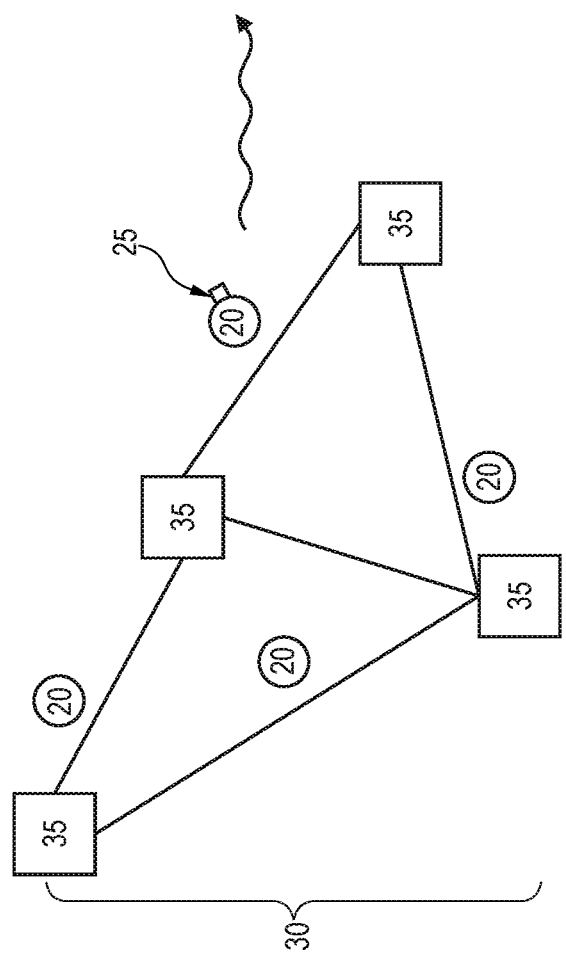

Generally, the present disclosure is directed to a system comprised of a network 10 of monitors 20 that sample signals including the time varying voltage and current at various points on a power grid 30. The power grid 30 includes a number of power grid components, represented generally by the reference number 35. The power grid components 35 include, but are not limited to, generators, switches, transformers, etc.

The monitors 20 may be deployed at residences and business connected to a standard 120 v (in US) electrical outlet, or the monitors 20 may be deployed at other points connected directly or indirectly to the power grid 30. The monitors 20 include transmitters 25 to send the sampled signals to a processing system 40. The processing system 40 includes a receiver 50 to receive said sample signals and an analyzer 60 for processing and analyzing a plurality of the received sample signals. It will be appreciated that the processing system 40 may be a cloud computing based analytical system or other type of system as described herein. A database 45 is connected into the processing system 40 and includes a number of component signatures representative of the power grid components 35. The analyzer 50 will output results identifying the operational status of individual power grid component 35. A communicator 70 communicates information to interested parties 80. The interested parties 80 include electric power market participants such as brokers, generators, etc.

In one aspect of the system, one or more of the monitors 20 sample current and voltage from a standard wall outlet in a home or an office. In other aspects of the system, one or more of the monitors 20 may sample currents and/or voltages from other power grid components 35, or may sample environmental fields or other physical phenomena (such as magnetic and electric fields near high voltage power lines) that are representative of or produced by the current and voltage. Alternately, samples collected by independently operated monitors and other devices operating on other networks could be imported into the system.

Figure 2:
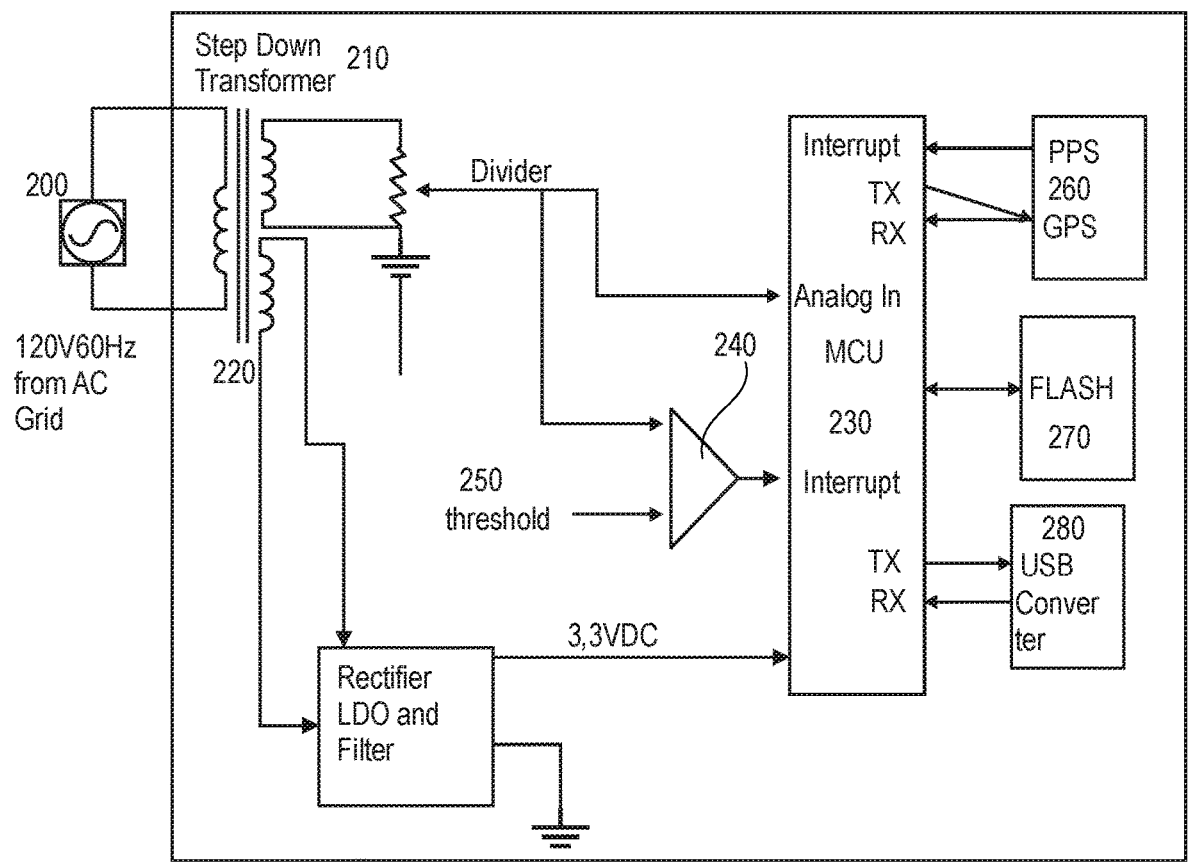
FIG. 2 shows an overview of a monitor.

FIG. 2 shows one non-limiting embodiment of the monitor 20 using voltage sampling. One skilled in the art will realize that other configurations are possible. The monitor 20 may sample either the current or the voltage, or both, at a sampling rate sufficient to calculate accurately the sampled waveform's characteristics including magnitude, phase, frequency, zero crossings, deviations from sinus shape, etc. In particular, the sampling rate must be sufficiently robust such that frequency harmonics and other waveform anomalies (i.e. deviations from regular sinusoidal waveforms that are caused by the operation of particular generators and/or other power grid components) may be calculated.

FIG. 2 shows a step-down transformer 210 that receives on one side a voltage from a source 200. The output of the step-down transformer 210 is connected to a voltage divider 220 which is in turn connected to a microprocessor 230 for sampling the waveform at the input Analog_In and also to a first input of a comparator 240. The other input of the operational amplifier 240 is connected to a threshold value 250. The output of the operational amplifier 240 is high when the voltage on the first input is greater than the threshold value 250.

The microprocessor 230 is connected to a positioning system 260, such as one depending on signal from the global positioning system, a memory 270 and a transmitter 280.

Figure 3:
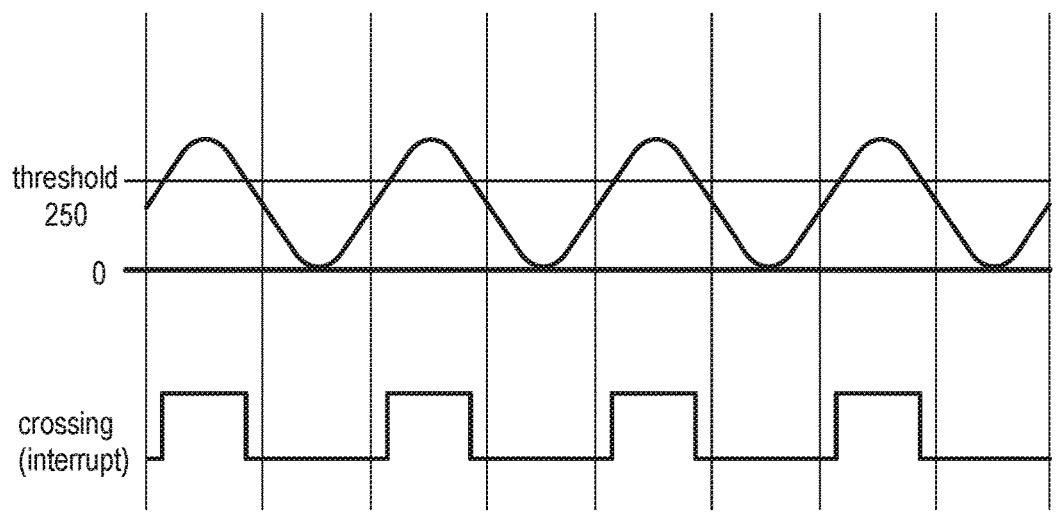
FIG. 3 shows the monitoring of waveforms.

As shown in FIG. 3, the output of the comparator 240 is high whenever the AC input is above the threshold value 250 and the rising edge of the transition is used as an interrupt to the microprocessor 230 to identify the phase of the 60 HZ input. The number of crossings of the threshold value 250 are counted by the microprocessor 230 and the period of every 60 crossings are compared to the highly accurate GPS PPS signal from the positioning system 260, which occurs once per second. The line frequency and phase of the source 200 are derived from this relationship. Other measurement specifics (sampling rates, ranges, etc.) could yield essentially the same result.

Figure 4:
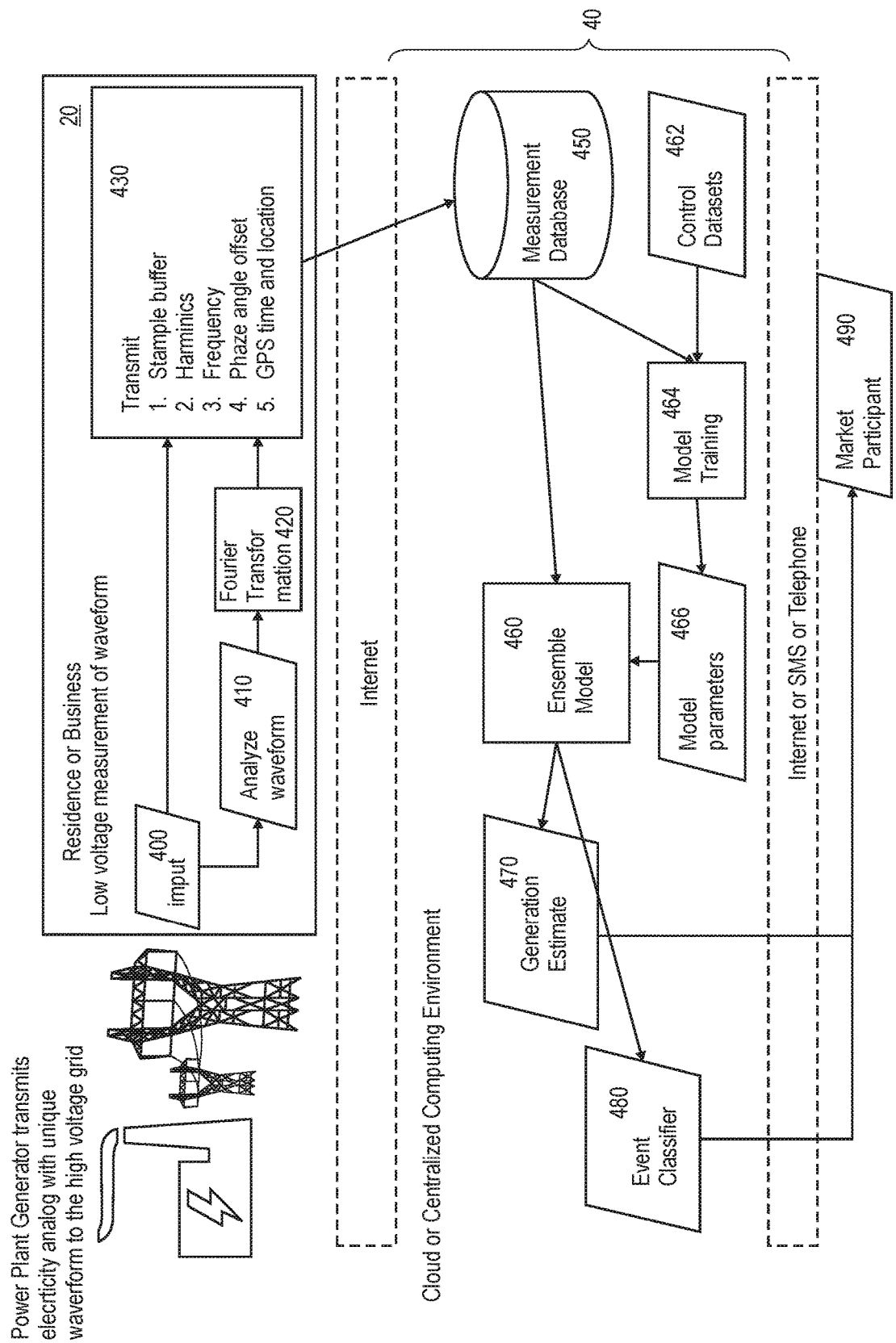
FIG. 4 shows an outline of the method of the invention.

The monitor 20 shown in FIG. 2 operates in the manner shown in the flow diagram of FIG. 4. In step 400, the monitor 20 receives an input. This could be through an electromagnetic field meter or a monitor connected to a low voltage source, e.g. power point. The location of the monitor 20 will be described later. The monitor 20 analyses the waveform in step 410. This analysis step 410 could be a sample of the waveform, for example at 3840 many times per second at the step-down transfer 210 at a, as can be seen in FIG. 3. The analysis could be a threshold crossing counter as seen in FIG. 2.

The monitor 20 determines the number of threshold crossings per time interval and compares them to PPS (pulse per second) from GPS signal received from the positioning system 260. The monitor 20 can also carry out a Fourier transformation of the waveform in step 420. The analysis is carried out in the monitor 20 in one aspect to reduce the amount of data, but it will be appreciated that raw data could be transferred to the processing system 40 for processing in the analysis system 40 instead of locally at the monitor 20.

The microprocessor can calculate the RMS for the voltage as $V_{rms} = V_{peak}/\sqrt{2}$ using the sampled values of the voltage waveform from step 430 and in step 460 is able to calculate the so-called Total Harmonic Distortion (THD). THD is defined as the ratio of total harmonics to the value at fundamental frequency.

$$THD = \frac{\sqrt{V_2^2 + V_3^2 + V_4^2 + \ldots + V_n^2}}{V_1}$$

where $V_1$ is the RMS voltage of nth harmonic and n=1 is the fundamental frequency.

This step involves performing a spectral analysis on the incoming line voltage and/or current and the power level of the odd harmonics of the 60 Hz inputs are used to calculate the Total Harmonic Distortion (THD). Various characteristics of the harmonic components of the sampled frequency are calculated, including harmonic frequencies, amplitudes, phases, wave shapes, waveform anomalies and variations in any of these over time. Further derivatives of these characteristics are calculated, including the ratio of amplitudes of the harmonic components, their respective phases, etc. Further, additional "anomalies" such as deviations from sinusoidal wave shape are calculated. This collection of characteristics and their derivatives are the "harmonic factors." In another embodiment, minor variations in the raw waveforms may be monitored. Along these lines, any variation from a pure sinusoidal shape may be indicative of operating conditions of a monitored power grid component.

The monitor transmits in step 430 the data, including the calculated harmonic factors, time, location and other data. This can be done via an MQTT protocol or via attached serial port to the processing system 40 for further processing. Other transmission protocols and calculation locations, such as on a fixed server, are possible. Alternately, raw or partially processed data may be transmitted with all further calculations performed at the separate location or locations.

The transmitted data is stored in a measurement database 450 and compared with a model in step 460 to generate in step 470 an estimate of affected ones of the components 35 and classified in step 480. Information about the events is transmitted to a market participant in 490 through the Internet, telephone, messaging service, etc. The model in 460 has been previously developed from using control datasets 462 and training in step 464 to produce model parameters 466. The model parameters 466 are supplied to the steps 470 and 480.

The sampled waveforms at any location on the power grid 30 are the result of the contemporaneous operation of all of the power grid components 35 associated with the power grid, with the contribution of each of the power grid component 35 at each point being the result of a complex interplay of the power grid components 35. Each component 35 of the power grid 30 may generate, suppress or otherwise influence the local frequency characteristics of the power grid 30. The primary causes of these effects on frequency characteristics include the stator windings of generators, the number of poles and the speed of each generator, and the specific setup of the generator. Other power grid components 35 similarly influence the local signal. It was the contribution of the inventor to the art to identify that such harmonic factors may be used to identify the operational status of such power grid components 35.

At each monitored or sample location on the power grid 25, the sampled voltage or current frequency is a product of many factors, including the specific frequency contribution of each of the power grid components 35 connected to the power grid 30 which generates the aforementioned component signature or fingerprint of the power grid component 35 for storage in the database 45. The harmonic factors sampled at the location are therefore a unique product of the local power grid configuration and the operational status of the power grid components 35 connected to the power grid.

Determining the operational status of the power grid components 35 in the power grid 30 is accomplished in steps 470 and 480 by any of the following or a combination thereof: comparing the sampled waveforms and/or the harmonic factors to the results of a power system model that a priori has calculated the expected waveform data values for each sample location for a range of particular operating status conditions; inputting the sampled waveforms and/or harmonic factors into a model that calculates the operational condition of the power grid components 35 based on such inputs; comparing the sampled waveforms and/or harmonic factors to a list of previously sampled waveforms and/or harmonic factors that have been temporally associated with the operational status of specific power grid components.

For example, each power generator contributes a unique or identifying harmonic frequency signal to the local power grid 30. Sampling the waveform near that generator can reveal whether or not that generator is operational by determining if that generator's harmonic "fingerprint" or signature is contributing to the sampled waveform.

Determining the signature of each generator is a process that uses one or more control datasets 462 and methods. The control datasets 462 used may include but are not limited to 1) Hourly gross generation from filings made to the US Environmental Protection Agency on a quarterly basis to report each power plant's hourly emissions to comply with the Clean Air Act, 2) discrete events such as unplanned outages as published by the US Department of Energy or the California ISO, 3) power grid frequency and ACE data as published by the regional ISO organizations, 4) real-time or historical operational datasets supplied by private companies. The temporal association of historical information with previously sampled waveforms allows the system to determine the harmonic signature of that particular generator by looking for the signal when the generator is operating and looking for the absence of a signal when the generator is not operating. Alternately, the harmonic signature of certain power grid components can be determined by model or empirically from other sources, such as the generator owner and/or operator that is familiar with such information.

The monitors 20 receive signals that are co-mingled from multiple generators and other power grid components. The monitors 20 may be located near power plants to improve the signal to noise ratio for a particular one of the power grid components 35, and may be located "exclusively close" to one or more of the power grid components 35 such that the sampled signal is dominated or significantly influenced by the monitored power grid component(s) 35, the making the determination of the operational status of the power grid component 35 straightforward. Generally speaking, the preferred locations for the monitors 20 are ones where the immediate local environment produces little harmonic "noise" and thus the signals measured by the monitors 20 are primarily the superposition of the frequency contributions from the significant components of the power grid 30, such as generators, transformers and major loads, the operational status of which are being determined.

In the present aspect, the monitors 20 are "plugged in" to wall outlets and sample the current and voltage at the low-voltage level directly, as shown in FIG. 2. but in other embodiments where, for example, the monitors 20 are sampling magnetic and/or electric fields produced by current and voltage, the monitors 20 may be installed near power lines or other power system components without direct monitor connection to the power grid. Some useful locations for monitor installations include, but are not limited to: plugged in at power traders or other interested end users, plugged in at paid private persons who will receive an annual stipend to host the monitor, plugged in at educational institutions such as university electrical engineering departments which may use the monitor data for educational purposes, plugged in at private companies that are reimbursed for hosting a monitor, installed in open air locations near power lines or other major power grid components such as substations and transformers to measure electric and/or magnetic fields or other physical phenomena (sound, UV light) associated with the voltage and/or current, attached directly to major power grid components 35, such as transmission lines using standard installation procedures for power system measuring equipment The monitors 20 transmit the harmonic factors, raw/partially processed data and/or other sampled or calculated data to the processing system 40 in as near-to-real-time as possible. The processing system 40 integrates the incoming data and performs the calculations as described herein to determine the operational status of one or more of the power grid components 25. The operational statuses (for example, the "on" or "off" status of a generator, or its current power output in MW, or a sudden change in status such as a "trip") are communicated to an end user in various ways including: over the Internet via web browser; via text or email message; by entry into a database or other data repository from which the end user accesses data via FTP or other protocol; by other means obvious to one skilled in the art.

Figure 5:
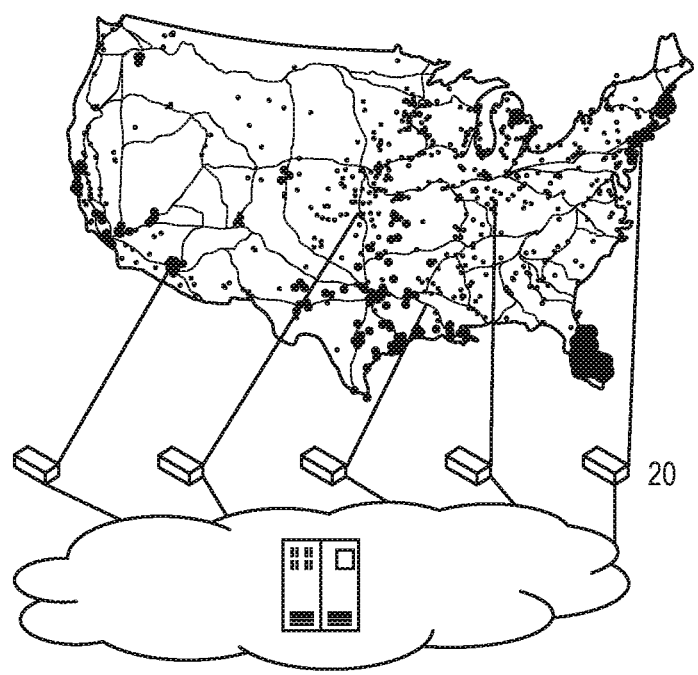
FIG. 5 shows locations of the monitors in the United States.

FIG. 5 shows a map of the United States. Each dot on the map represents a power plant. In the exemplary illustration, each power plant may have one or more monitors 20 located in proximity thereto (partially illustrated). Each of the monitors reports to the processing system 40. In practice, all or any subset of power plants may be monitored (east grid, west grid, Texas grid, natural gas power plants only etc.) based on end user needs.

Figure 6:
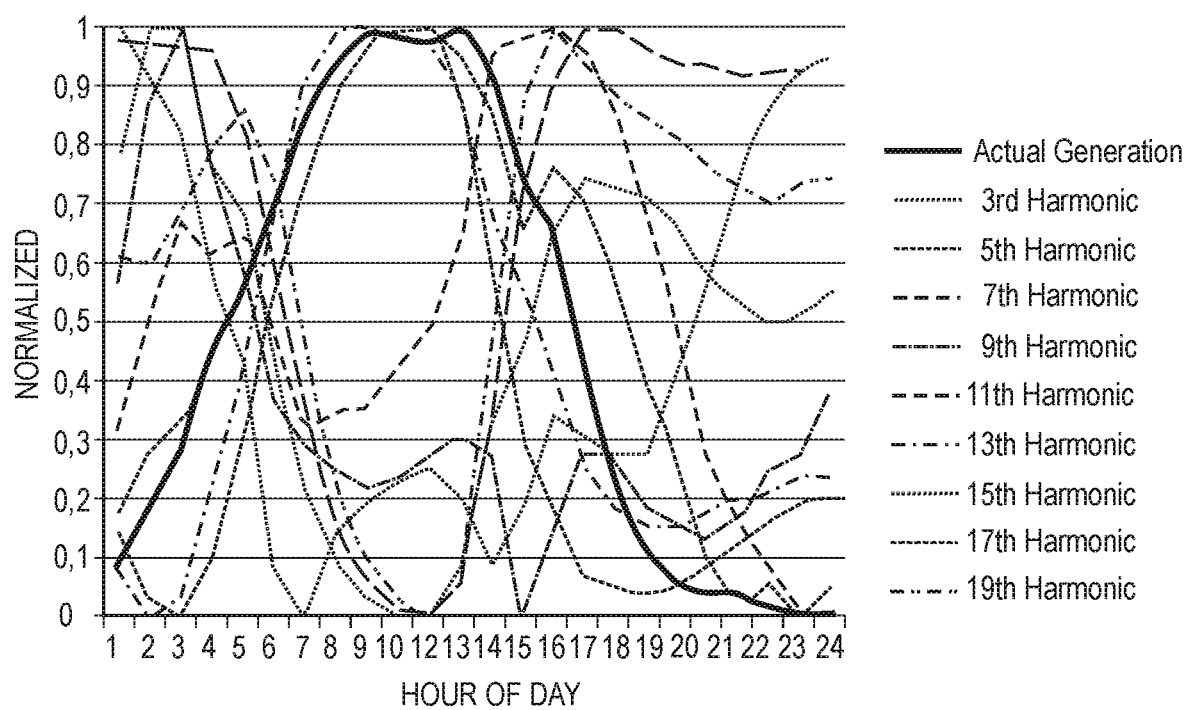
FIG. 6 shows normalized harmonic frequencies from a power station.

An enabling example will now be described with reference to FIG. 5. Suppose that the monitor 20 measuring the voltage odd number frequencies is deployed within 5 miles of a coal fired power plant. Other distances are possible. Each frequency is summarized by normalizing using feature scaling or (value-min)/(max-min) in order to make the values on the same scale of 0 to 1. FIG. 6 is an example of the frequency plot (vertical axis) against gross output in MW of the Valmont Unit 5 184 MW coal unit in Boulder, Colo., and illustrates how the individual odd numbered harmonic voltage frequencies (h3, h5, h7, see right hand axis) have strong correlations to the generation output. The observation period was 2015 Jul. 31 thru 2015 Dec. 8

Figure 7:
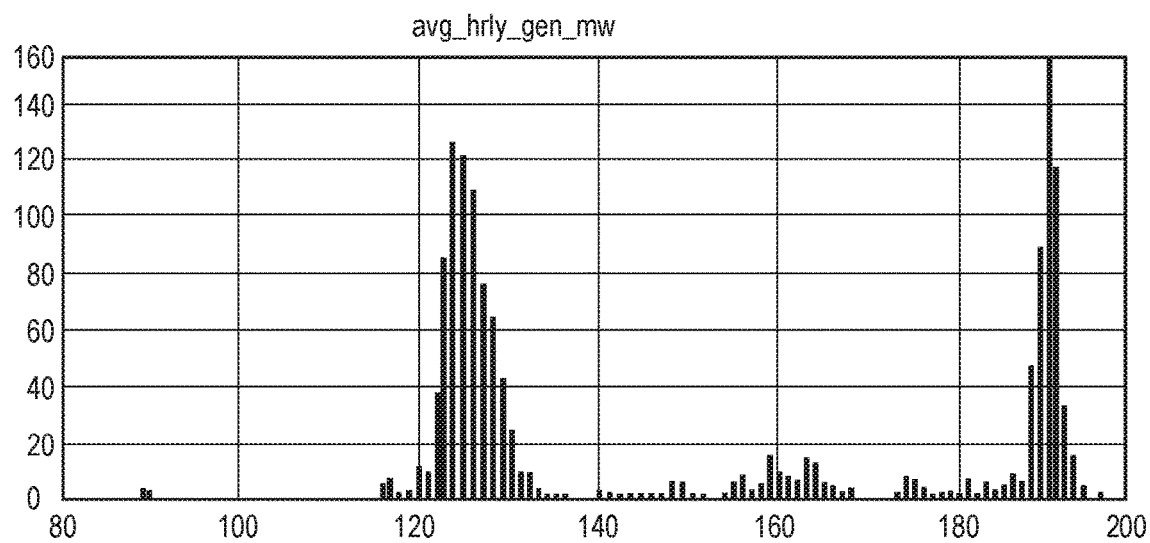
FIG. 7 shows continuous emission monitoring data from the power station.

Using the control data set of hourly gross generation in MW from the EPA's Continuous Emission Monitoring data shown in FIG. 7, it can be seen that there are two clear loading blocks near 160 MW which is likely the minimum loading level and 190 MW which is the maximum capacity.

Figure 8A:
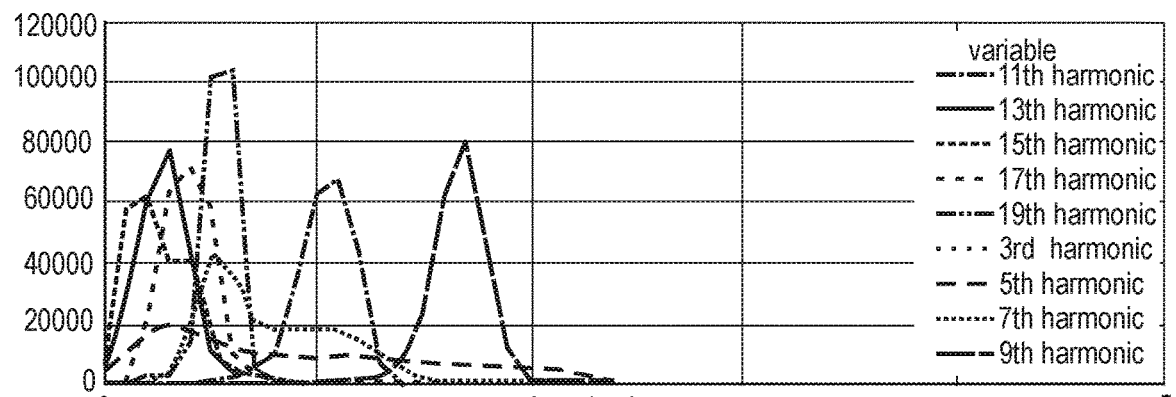
FIGS. 8A and 8B show frequency plots of the electrical power from the power station.
Figure 8B:
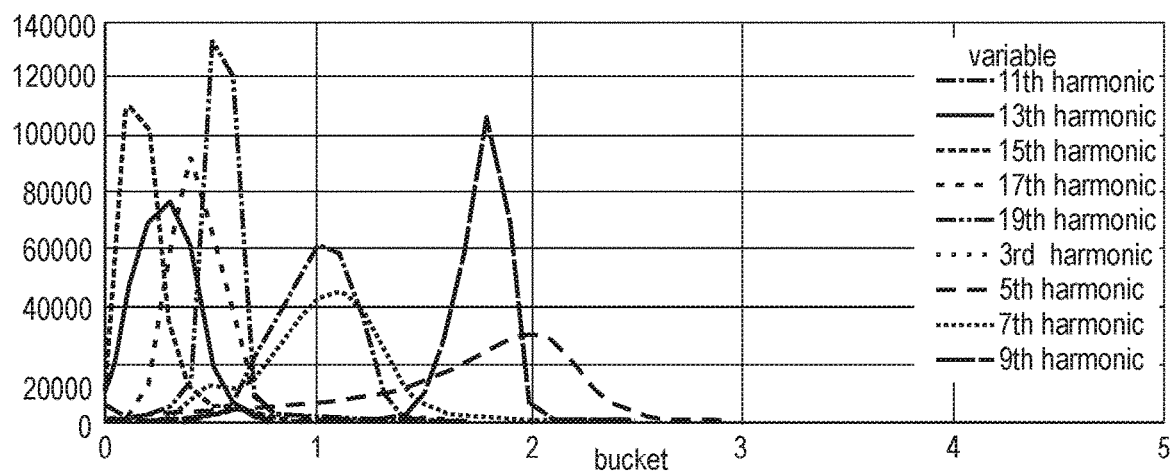

We can separate the harmonics analysis into these two discrete operating states identified using FIG. 7. The analysis of harmonics is then separated into two discrete modes for when the generator is operating at 160 MW output versus 190 MW output. By examining the frequency plots (FIG. 8) of each harmonic the two discrete levels of output it is clear that both the 5th and 7th harmonics take on different values for the different states of operation. FIG. 8A shows the Valmont 5 operating above 180 MW (focused on 5th to 19th harmonics) and FIG. 8B shows the Valmont 5 between 120 MW and 140 MW (focused on 5th to 19th harmonics).

Figure 9:
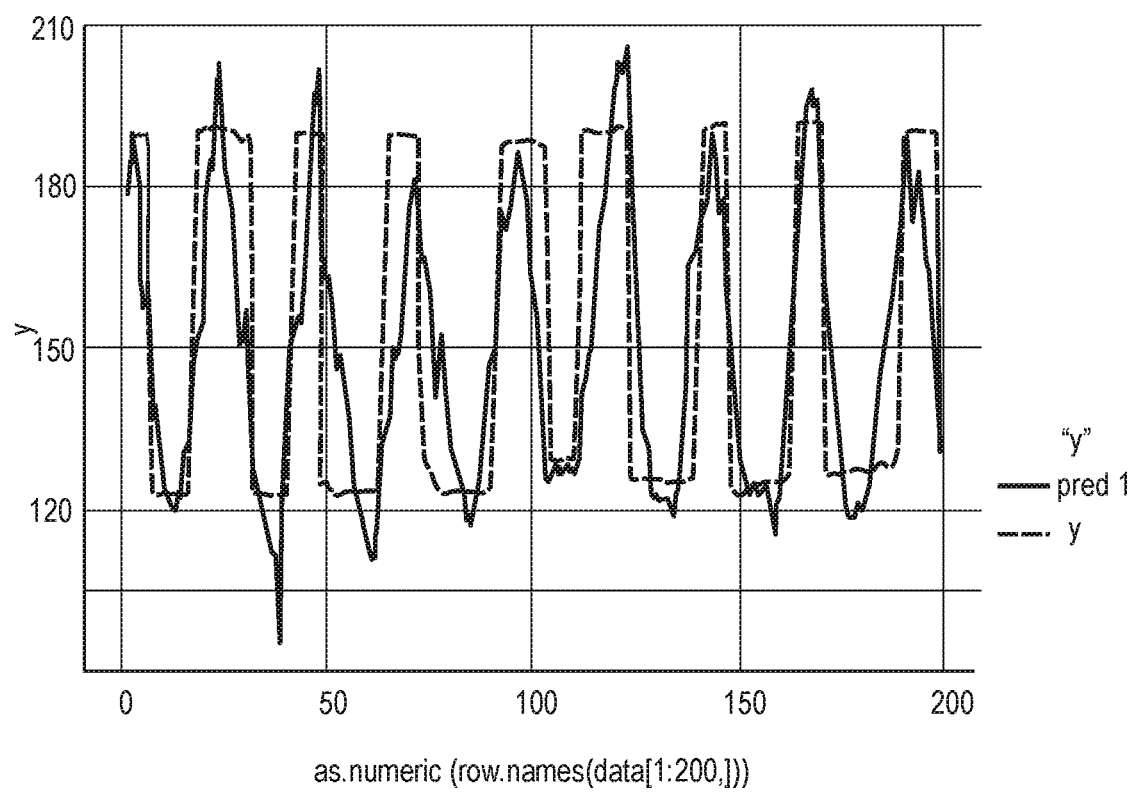
FIG. 9 shows the fitting of the waveforms into a multivariate regression model.

FIG. 9 shows the fitting the 3rd through 19th harmonics into a multivariate regression model. The processing system is able to predict the value of generation output as illustrated in FIG. 9.

In FIG. 9, the residual standard error is 22.76 on 190 degrees of freedom. Multiple R-squared: 0.7208, Adjusted R-squared: 0.5077 F-statistic: 3.383 on 145 and 190 DF, p-value: 3.433e-15

It will be appreciated that many power generating plants have a plurality of generators. For instance, a power plant may have a main generator (e.g., coal fired) and one or more additional generators (e.g., gas turbine units). The additional generators may come on line to alleviate demand spikes. The utilities disclosed above allow for identifying in real time when these units begin and/or terminate operation.

REFERENCE NUMBERS

10 Network
20 Monitors
30 Power grid
35 Power grid components
40 Processing system
45 Database
50 Receiver
60 Analyzer
70 Communicator
80 Interested parties
200 Source
210 Step-down transformer
230 Microprocessor
240 Comparator
250 Threshold value
260 Positioning system
270 Memory
280 Transmitter 280

The invention claimed is:

1. A method for determining an operational status of one or more power grid components of a power grid comprising one or more of generators, switches, and transformers, the one or more power grid components having component signatures representative of operational statuses of the power grid component, the method comprising:
   obtaining using a monitor at least one of a current waveform or a voltage waveform at at least one location within a high-voltage part of the power grid;
   analyzing the obtained one of the current waveform or the voltage waveform at at least one location;
   establishing one or more waveform data values of the waveform;
   accessing a database having a plurality of component signatures representative of operational statuses of the one or more power grid components; and
   by comparison of the waveform data values with the component signatures producing one or more results representative of the operational status of the one or more power grid components.

2. The method of claim 1, wherein the analyzing of the obtained one of the current waveform or the voltage waveform comprises performing at least one of a spectral analysis, a Fourier transform to produce the waveform data values.

3. The method of claim 1, wherein the obtaining of the current waveform or the voltage waveform comprises digitally sampling the waveform.

4. A system for determining an operational status of one or more power grid components in a power grid comprising one or more of generators, switches, and transformers, the system comprising:
- a monitor for obtaining at least one location within the high-voltage power grid at least one of a current waveform or a voltage waveform and producing waveform data values;
- a database comprising a plurality of component signatures representative of the operation statuses of the one or more power grid components; and
- a processing system for analyzing the waveform data values and comparing the waveform data with the plurality of component signatures.

5. The system of claim 4, wherein the waveform data is representative of at least one of harmonic factors and waveform anomalies in one of the current waveform or the voltage waveform.

6. The system of claim 4, wherein the processing system is one of a cloud processing system or a central server.

\* \* \* \* \*